(12) United States Patent
Gonzalez et al.

(10) Patent No.: US 6,498,378 B1
(45) Date of Patent: Dec. 24, 2002

(54) METHODS OF FORMING FIELD EFFECT TRANSISTORS AND INTEGRATED CIRCUITRY

(75) Inventors: Fernando Gonzalez; Chandra Mouli, both of Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/708,360

(22) Filed: Nov. 7, 2000

Related U.S. Application Data (62) Division of application No. 09/360,230, filed on Jul. 23, 1999.

(51) Int. Cl.$^7$ .............................................. H01L 29/72
(52) U.S. Cl. ...................... 257/412; 257/764; 257/770; 257/915
(58) Field of Search ................................ 257/412, 764, 257/915, 770

(56) References Cited

U.S. PATENT DOCUMENTS

| | | | |
|---|---|---|---|
| 5,091,763 A | * 2/1992 | Sanchez | ..................... 257/216 |
| 5,341,016 A | * 8/1994 | Prall et al. | ................... 257/915 |
| 5,604,140 A | 2/1997 | Byun | |
| 5,677,563 A | * 10/1997 | Cronin et al. | ................ 257/915 |
| 5,939,750 A | 8/1999 | Early | |
| 5,948,702 A | 9/1999 | Rotondaro | |
| 6,049,114 A | 4/2000 | Maiti et al. | |
| 6,091,120 A | 7/2000 | Yeom et al. | |
| 6,187,674 B1 | 2/2001 | Chen et al. | |
| 6,222,240 B1 | 4/2001 | Gardner et al. | |
| 6,236,094 B1 | 5/2001 | Wright | |
| 6,261,934 B1 | 7/2001 | Kraft et al. | |
| 6,303,483 B1 | 10/2001 | Kunikiyo | |

* cited by examiner

Primary Examiner—Edward Wojciechowicz
(74) Attorney, Agent, or Firm—Wells St. John P.S.

(57) ABSTRACT

The invention encompasses integrated circuitry which includes a semiconductive material substrate and a first field effect transistor supported by the substrate. The first field effect transistor comprises a first transistor gate assembly which includes a first layer of conductively doped semiconductive material and only one layer of conductive nitride. The integrated circuitry further comprises a second field effect transistor supported by the substrate. The second field effect transistor comprises a second transistor gate assembly which includes a second layer of conductively doped semiconductor material and at least two layers of conductive nitride. The invention also encompasses a field effect transistor assembly which includes a channel region and an insulative material along the channel region. The transistor assembly further includes a gate stack proximate the channel region. The gate stack includes a first conductive nitride layer separated from the channel region by the insulative material. The stack further includes a conductively doped semiconductive material proximate the first conductive nitride layer, and a second conductive nitride layer separated from the first conductive nitride layer by the conductively doped semiconductive material. Additionally, the invention encompasses methods of forming field effect transistors, and methods of forming integrated circuitry.

33 Claims, 9 Drawing Sheets

METHODS OF FORMING FIELD EFFECT TRANSISTORS AND INTEGRATED CIRCUITRY

RELATED PATENT DATA

This patent resulted from a divisional application of U.S. patent application Ser. No. 09/360,230, which was filed on Jul. 23, 1999.

TECHNICAL FIELD

The invention pertains to integrated circuitry, field effect transistor assemblies, methods of forming field effect transistors, and methods of forming integrated circuitry.

BACKGROUND OF THE INVENTION

Figure 1:
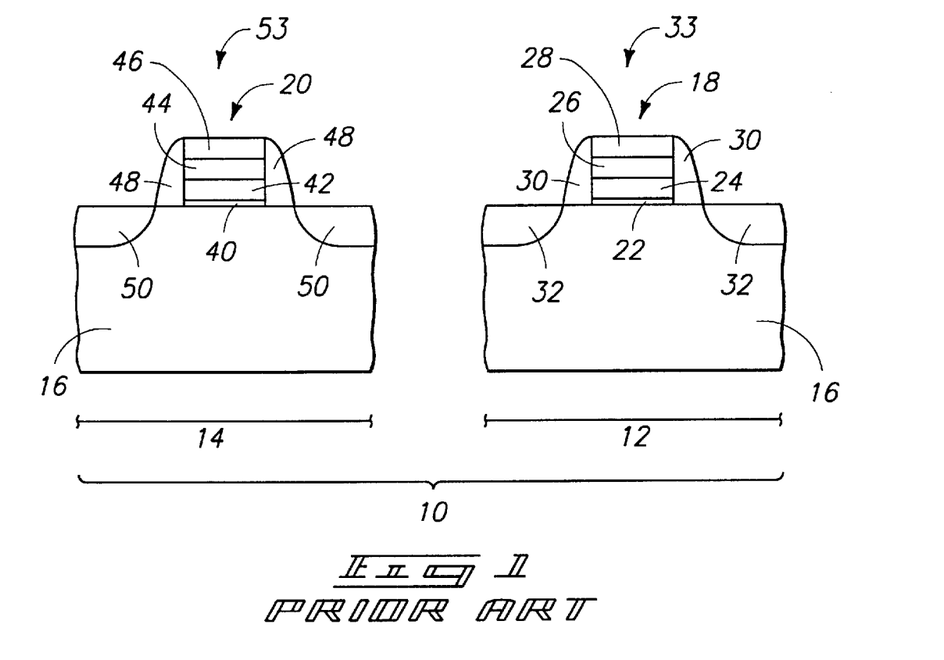
FIG. 1 is a diagrammatic, schematic, cross-sectional view of a prior art semiconductor wafer fragment.

A prior art semiconductive wafer fragment 10 is shown in FIG. 1. Wafer fragment 10 comprises a memory array region 12 and a region 14 peripheral to memory array region 12. Wafer fragment 10 further comprises a semiconductive material substrate 16. Substrate 16 can comprise, for example, a monocrystalline silicon wafer lightly background doped with a p-type dopant. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

A memory array transistor gate 18 is formed over memory array region 12. Transistor gate 18 comprises a stack of materials including gate dielectric 22, a conductively doped polysilicon 24, a metal silicide 26, and an insulative cap 28. Gate dielectric 22 can comprise, for example, silicon dioxide or tantalum pentoxide. Conductively doped polysilicon 24 can be doped to a concentration of, for example, greater than $10^9$ atoms/cm$^3$ with either n-type or p-type conductivity enhancing dopant. Metal silicide 26 can comprise, for example, titanium silicide. Finally, insulative cap 28 can comprise, for example, silicon dioxide or silicon nitride. Alternatively, cap 28 can comprise a stack of materials including an antireflective coating and other insulative materials such as, for example, silicon nitride. The antireflective coating can comprise, for example, a deposited antireflective coating (DARC).

Sidewalls 30 are provided adjacent the transistor gate, and can comprise, for example, silicon dioxide or silicon nitride.

Source/drain regions 32 are provided within substrate 12 proximate gate 18, and together with gate 18 form an operative field effect transistor device 33. Source/drain regions 32 are typically doped with n-type conductivity-enhancing dopant.

A peripheral transistor gate 20 is formed over peripheral region 14. Transistor gate 20 comprises a stack of gate dielectric 40, conductively doped polysilicon 42, metal silicide 44, and an insulative cap 46. Gate dielectric 40, conductively doped polysilicon 42, silicide 44 and insulative cap 46 can comprise materials such as those discussed above pertaining to gate dielectric 22, conductively doped polysilicon 24, silicide 26 and cap 28, respectively.

Sidewalls 48 are provided adjacent gate stack 20, and source/drain regions 50 are provided within substrate 16 proximate to gate stack 20. Source/drain regions 50 and gate stack 20 together form a functional field effect transistor 53. Source/drain regions 50 can be doped with p-type conductivity enhancing dopant or n-type conductivity enhancing dopant to form either a p-type metal-oxide semiconductor (PMOS) or n-type metal-oxide semiconductor (NMOS) transistor. Such transistor can be incorporated into, for example, complementary metal-oxide semiconductor (CMOS) circuitry.

The functions of transistors 33 and 53 are different, and accordingly problems associated with gates 18 and 20 can be somewhat different. For instance, a problem associated with transistor gates in a memory array (such as, for example, a dynamic random access memory (DRAM) array) is leakage current between source and drain regions, and a problem associated with peripheral transistor gates is the speed of a change from an off-current to an on-current. The above-mentioned problems can be differently affected by a thickness of a gate dielectric material. Accordingly, there has been an effort to vary the thickness of dielectric material 40 of the peripheral transistor 53 relative to the thickness of dielectric material 22 of memory array transistor 33. Ideally, dielectric material 22 would be as thin as possible, and dielectric material 40 would be somewhat thicker. Presently, dielectric materials can be formed to thicknesses of as little as about 50 Angstroms, but it has proved difficult to reliably form the materials thinner than 50 Angstroms. Such difficulty results from the inherent size and spacing of atoms. For instance, a silicon structure will typically have about a 5.3 Angstrom separation between atoms. Accordingly, a gate dielectric comprising silicon and which is 50 Angstroms thick will have a maximum of 10 monolayers of silicon atoms. Thus, even small inhomogeneities within or between the monolayers can significantly impact the uniformity of a material comprising the layers, and accordingly destroy device operation of transistor gate devices formed utilizing such material.

It would be desirable to develop alternative methods and structures for controlling physical and electrical properties of transistor gates.

SUMMARY OF THE INVENTION

In one aspect, the invention encompasses integrated circuitry. Such circuitry includes a semiconductive material substrate and a first field effect transistor supported by the substrate. The first field effect transistor comprises a first transistor gate assembly which includes a first layer of conductively doped semiconductive material and only one layer of conductive nitride. The integrated circuitry further comprises a second field effect transistor supported by the substrate. The second field effect transistor comprises a second transistor gate assembly which includes a second layer of conductively doped semiconductor material and at least two layers of conductive nitride.

In another aspect, the invention encompasses a field effect transistor assembly. Such assembly includes a substrate and source/drain regions supported by the substrate. A channel region is defined between the source/drain regions, and the transistor assembly includes an insulative material along the channel region. The transistor assembly further includes a gate stack proximate the channel region. The gate stack includes a first conductive nitride layer separated from the channel region by the insulative material. The stack further includes a conductively doped semiconductive material proximate the first conductive nitride layer, and a second conductive nitride layer separated from the first conductive nitride layer by the conductively doped semiconductive material.

In yet other aspects, the invention encompasses methods of forming field effect transistors, and methods of forming integrated circuitry.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 2:
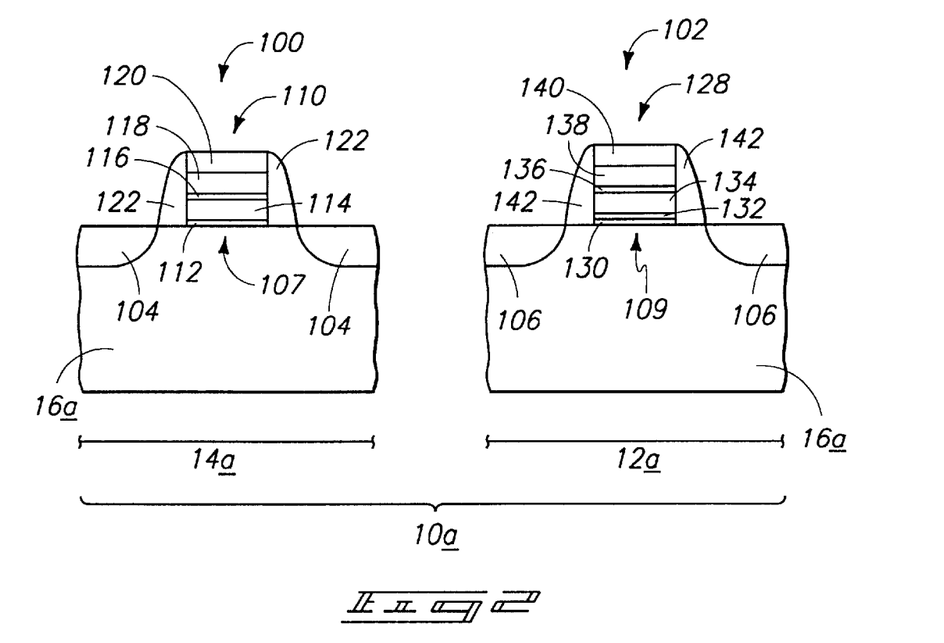
FIG. 2 is a diagrammatic, schematic, cross-sectional view of a semiconductor wafer fragment encompassed by the present invention.

FIG. 2 shows a semiconductor wafer fragment 10a comprising transistor structures encompassed by the present invention. In referring to FIG. 2, some structures will be labeled with similar numbering as was utilized above in describing the prior art, with the suffix "a" utilized to indicate structures shown in FIG. 2.

Wafer fragment 10a comprises a memory array region 12a, and a region 14a peripheral to the memory array region. Wafer fragment 10a includes a substrate 16a which can comprise, for example, monocrystalline silicon. A first field effect transistor assembly 100 is formed within peripheral region 14a and supported by substrate 16a, and a second field effect transistor assembly 102 is formed with memory array region 12a and supported by substrate 16a. First field effect transistor assembly 100 comprises first source/drain regions 104, and second transistor assembly 102 comprises second source/drain regions 106. A first channel region 107 is defined to extend between first source/drain regions 104, and a second channel region 109 is defined to extend between second source/drain regions 106. Source/drain regions 104 can comprise materials similar to those described above regarding source/drain regions 50 of FIG. 1, and source/drain regions 106 can comprise materials similar to those discussed above regarding source/drain regions 32 of FIG. 1.

First field effect transistor assembly 100 comprises a first transistor gate assembly 110 formed along first channel region 107, and comprises spacers 122 formed adjacent the gate assembly 110. Spacers 122 can comprise, for example, insulative materials such as silicon dioxide or silicon nitride.

Gate assembly 110 includes a stack comprising a first insulative material 112, a first conductively doped semiconductive material 114, and a first conductive nitride material 116. In the shown embodiment, a lowestmost portion of the stack consists of materials 112, 114 and 116.

Insulative material 112 can comprise, for example, silicon dioxide, silicon nitride, $SiN_xO_y$, or tantalum pentoxide. Material 112 can define a layer having a thickness of from about 15 Å to about 75 Å. Material 112 can, for example, define a layer comprising a construction identical to that of the prior art gate dielectric 40 described above with reference to FIG. 1.

Conductively doped semiconductive material 114 can comprise, for example, conductively doped polysilicon. Such polysilicon is preferably doped to a concentration of at least $10^{19}$ atoms/cm$^3$ with either n-type or p-type conductivity enhancing dopant. It is noted that an effective dopant concentration range (i.e., a dopant concentration range which renders the polysilicon conductive) within polysilicon material 114 can be increased relative to the effective dopant range of prior transistor structures due to a diminished depletion effect resulting from incorporation of conductive nitride material 116. Specifically, an effective dopant concentration range of a prior conductively doped polysilicon material in a transistor gate (such as material 42 of FIG. 1) is typically from $10^{20}$ atoms/cm$^3$ to about $10^{21}$ atoms/cm$^3$, whereas an effective dopant concentration of doped polysilicon material 114 can be from $10^{19}$ atoms/cm$^3$ to about $10^{21}$ atoms/cm$^3$. The layer defined by material 114 is preferably from about 100 Å thick to about 800 Å thick, and can be, for example, about 500 Å thick.

Conductive nitride material 116 can comprise, for example, a metal nitride (such as, for example, titanium nitride), and preferably defines a layer that is from about 25 Å thick to about 100 Å thick. Such layer can be, for example, about 40 Å thick, and can be formed by, for example, chemical vapor deposition, plasma enhanced chemical vapor deposition, or sputter deposition.

Materials 112, 114 and 116 are stacked from channel region 107 in the order of material 112 first, material 114 second, and material 116 third. Accordingly, conductively doped semiconductive material 114 is separated from substrate 16a by insulative material 112, and conductive nitride material 116 is separated from insulative material 112 by conductively doped semiconductive material 114.

In addition to the materials described above, gate assembly 110 comprises a metal-containing material 118, and an insulative cap 120. Metal-containing material 118 can comprise, for example, tungsten, and can, for example, have a thickness of from about 350 Å to about 600 Å. Further, metal-containing material 118 can consist essentially of an elemental form of a metal, such as, for example, elemental tungsten.

Insulative cap 120 can comprise, for example, silicon nitride or silicon dioxide, and can, for example, define a layer having a thickness of from about 350 Å to about 600 Å. Also, insulative cap 120 can comprise a stack of insulative materials, such as, for example, a stack comprising DARC and nitride.

Second field effect transistor assembly 102 comprises a second transistor gate assembly 128 formed along second channel region 109, and comprises spacers 142 formed adjacent the gate assembly 128. Spacers 142 can comprise, for example, insulative materials such as silicon dioxide or silicon nitride.

Gate assembly 128 comprises a second insulative material 130, a second conductive nitride material 132, a second conductively doped semiconductive material 134, a third conductive nitride material 136, a second metal-containing material 138, and a second insulative cap 140. In the shown embodiment, conductively doped semiconductive material 134 is between and against layers defined by conductive nitride materials 132 and 136.

Second insulative material 130 can comprise an identical composition as first insulative material 112. Conductive nitride materials 132 and 136 can comprise constructions identical to that described above for material 116, and accordingly can comprise titanium nitride and thicknesses of from about 25 Å to about 100 Å. Semiconductive material 134 can comprise a construction identical to that described above for material 114, and accordingly can comprise conductively doped polysilicon. Metal-containing material 138 and insulative cap 140 can comprise identical structures as described above regarding metal-containing material 118 and insulative cap 120. Accordingly, material 138 can comprise, for example tungsten, and insulative cap 140 can comprise, for example, silicon dioxide, silicon nitride, or a stack of insulative materials.

Transistor assembly 100 is preferably constructed to enable a fast transition from an off-state to an on-state, and vice versa, while transistor assembly 102 is preferably configured to reduce leakage between the source and drain regions 106.

A difference between gate assembly 110 of device 100 and gate assembly 128 of device 102 is that assembly 110 comprises only one layer of conductive nitride, whereas assembly 102 comprises more than one layer of conductive nitride. Another difference between assembly 110 and assembly 102 is that the conductively doped semiconductive material 114 of assembly 110 is not between any layers of conductive nitride, whereas the conductively doped semiconductive material 134 of assembly 128 is between a pair of conductive nitride layers.

It is noted that assembly 128 can comprise more than the two shown nitride layers defined by materials 132 and 136, and that such layers can themselves comprise stacks of two or more conductive nitride materials. In other words, materials 132 and 136 can comprise either relatively homogeneous compositions throughout the layers defined by materials 132 and 136, or can comprise heterogenous compositions. For instance, one or both of materials 132 and 136 can comprise differing compositions of metal and nitrogen throughout its thickness so that layers defined by one or both of materials 132 and 136 can alternatively be considered as comprising a plurality of different conductive nitride layers. Materials 132 and 136 are to be understood to comprise conductive nitride, unless it is specifically stated that such materials consist essentially of conductive nitride.

It is also noted that assembly 110 can comprise more than the single shown layer defined by conductive nitride material 116. Similarly to the above-discussed materials 132 and 136, material 116 can comprise either a relatively homogeneous composition throughout the layer defined by material 116, or can comprise a heterogenous composition. For instance, material 116 can comprise differing compositions of metal and nitrogen throughout its thickness so that a layer defined by material 116 can alternatively be considered as comprising a plurality of different conductive nitride layers. Material 116 is to be understood to comprise conductive nitride, unless it is specifically stated that such material consists essentially of conductive nitride A first embodiment method of forming the structure of FIG. 2 is described with reference to FIGS. 3–7. In referring to FIGS. 3–7, similar numbering will be utilized as was used above in describing FIG. 2.

Figure 3:
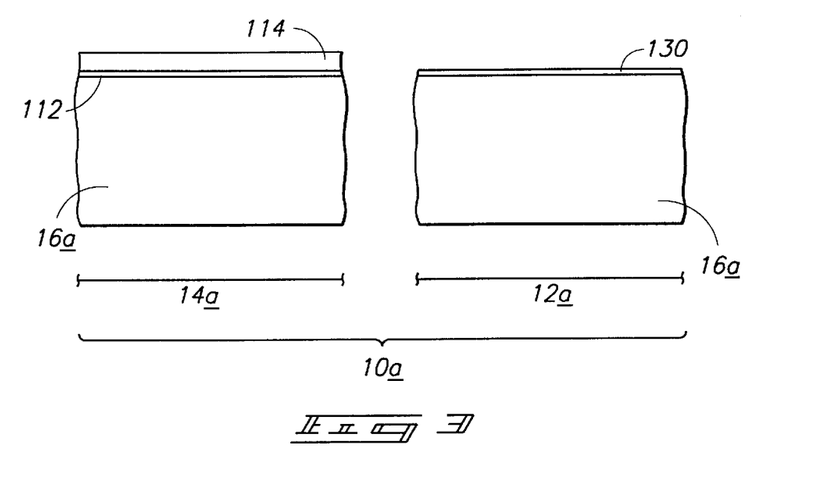
FIG. 3 is a diagrammatic, cross-sectional, schematic, fragmentary view of a semiconductor wafer fragment at an initial step in a processing sequence utilized to form the construction of FIG. 2.

Referring to FIG. 3, semiconductive wafer fragment 10a is shown at an initial step of the processing sequence. Fragment 10a comprises substrate 16a, and insulative materials 112 and 130 formed thereover. Preferably, insulative materials 112 and 130 are portions of a continuous insulative structure formed over substrate 16a, and accordingly have the same chemical composition as one another. Insulative materials 112 and 130 can comprise, for example, silicon dioxide, and can be formed by either growing a layer of silicon dioxide over a silicon substrate 16a, or by chemical vapor deposition. Alternatively, and by way of example only, materials 112 and 130 can comprise tantalum pentoxide, and can be formed by chemical vapor deposition over substrate 16a.

Conductively doped semiconductive material 114 is shown selectively formed over peripheral region 14a, and not over memory array region 12a. Such can be accomplished by, for example, chemical vapor deposition and doping of polysilicon, and subsequent photolithographic processing to pattern the conductively doped polysilicon to remain only over region 14a.

Figure 4:
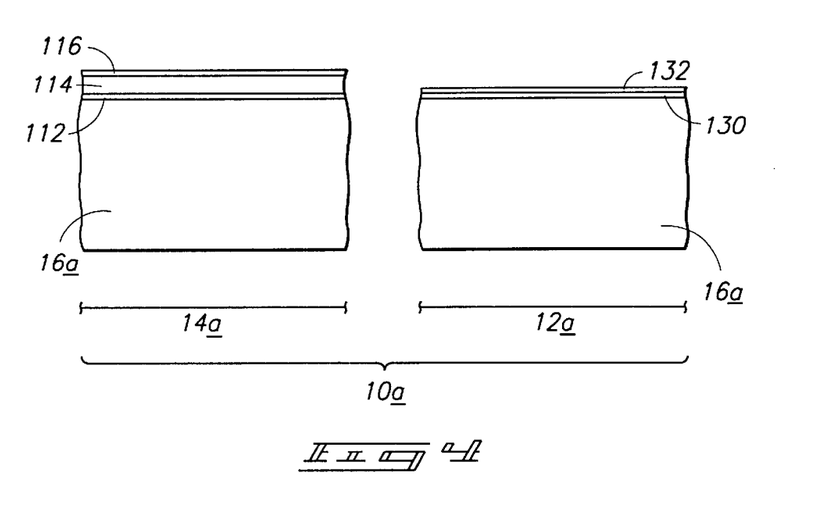
FIG. 4 is a view of the FIG. 3 wafer fragment shown at a step subsequent to that of FIG. 3.

Referring to FIG. 4, layers comprising conductive nitride material 116 and 132 are formed over regions 14a and 12a, respectively. Preferably, such layers comprise a common conductive nitride material, such as, for example, titanium nitride, and are formed together, such as in a common chemical vapor deposition process.

Figure 5:
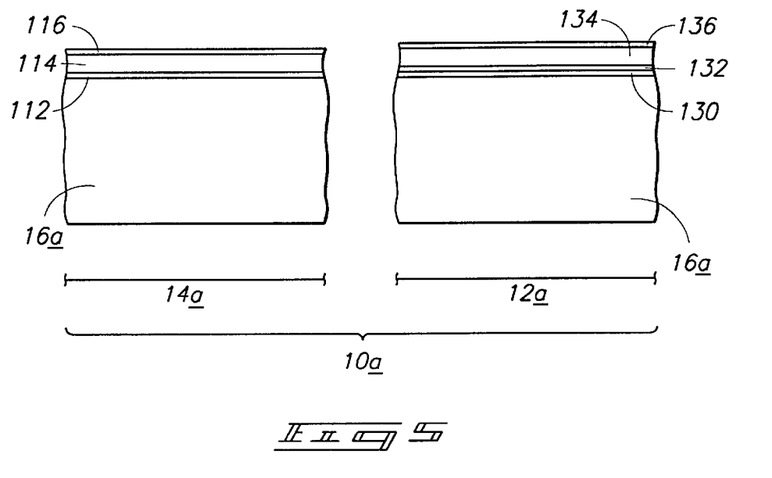
FIG. 5 is a view of the FIG. 3 wafer fragment shown at a step subsequent to that of FIG. 4.

Referring to FIG. 5, conductively doped semiconductor material 134 and a layer of second conductive nitride material 136 are formed over memory array region 12a. Material 134 can be formed by, for example, chemical vapor deposition of polysilicon and subsequent doping of the polysilicon, Conductive nitride material 136 can be formed by, for example, chemical vapor deposition of titanium nitride. Layers defined by materials 134 and 136 can be patterned to be only over region 12a, and not over region 14a, by, for example, photolithographic processing. In alternative embodiments of the invention (not shown), materials 134 and 136 could be left over region 14a as well as over region 12a during subsequent processing.

Figure 6:
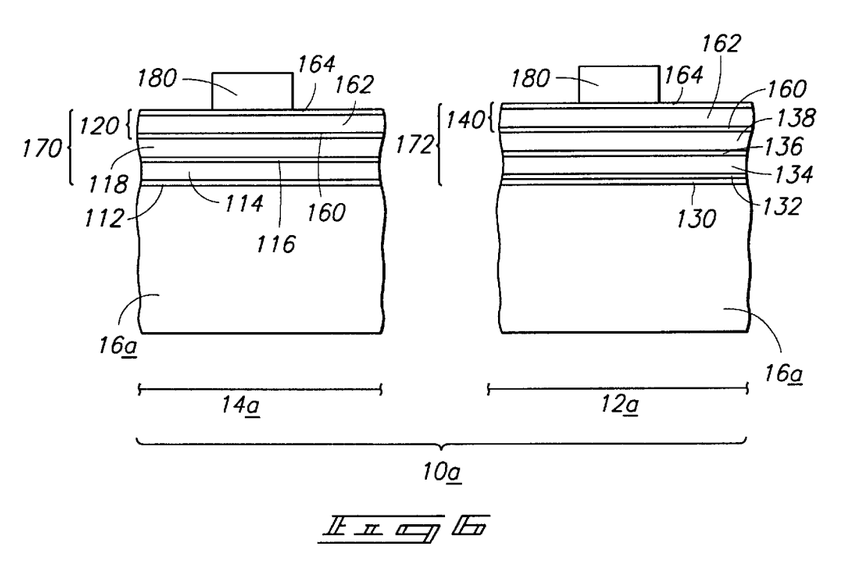
FIG. 6 is a view of the FIG. 3 wafer fragment shown at a step subsequent to that of FIG. 5.

Referring to FIG. 6, metal layers 118 and 138 are formed over regions 14a and 12a, respectively, and insulative cap layers 120 and 140 are formed over metal layers 118 and 138, respectively. Metal layers 118 and 138 can comprise a common material, and can be formed in a common processing step. For instance, metal layers 118 and 138 can comprise tungsten, and can be formed in a common sputtering process. Insulative cap layers 120 and 140 can comprise common constructions and can be formed by common processing. In the shown embodiment, insulative cap layers 120 and 140 comprise stacks of a DARC material 160, a silicon nitride material 162, and another DARC material 164.

Materials 112, 114, 116, 118 and 120 form a first stack 170, while materials 130, 132, 134, 136, 138 and 140 form a second stack 172. A masking material 180 is formed over stacks 170 and 172, and patterned into blocks. Material 180 can comprise, for example, photoresist, and can be patterned utilizing photolithographic processing.

Figure 7:
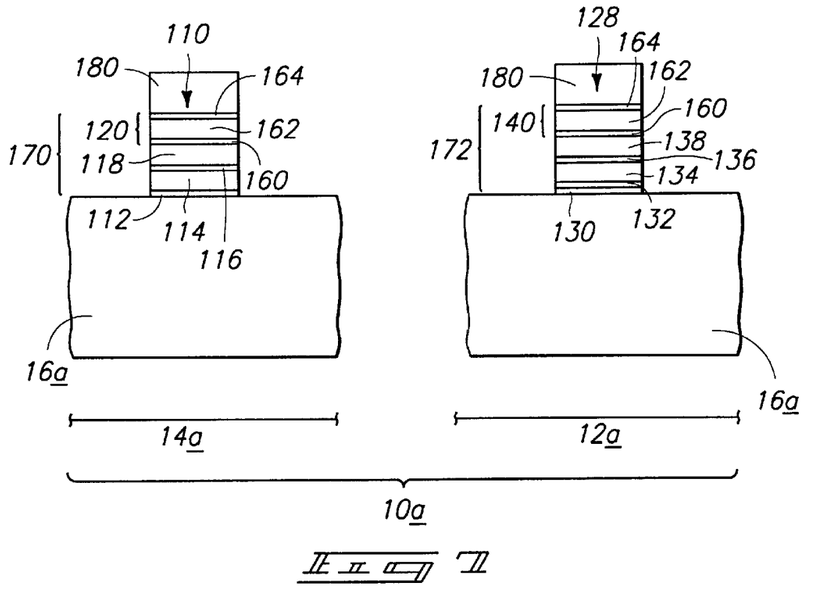
FIG. 7 is a view of the FIG. 3 wafer fragment shown at a step subsequent to that of FIG. 6.

Referring to FIG. 7, a pattern is transferred from masking material 180 to underlying stacks 170 and 172. Such transfer can be accomplished by, for example, etching of the material of stacks 170 and 172. The etching converts stacks 170 and 172 into patterns corresponding to gate stacks 110 and 128, respectively. Stacks 110 and 128 can be incorporated into the structures of FIG. 2 by formation of spacers and source/drain regions proximate the stacks.

Another method of forming the structures of FIG. 2 is described with reference to FIGS. 8 and 9. In referring to FIGS. 8 and 9, identical numbering will be used as was utilized above in describing the embodiment of FIGS. 3–7.

Figure 8:
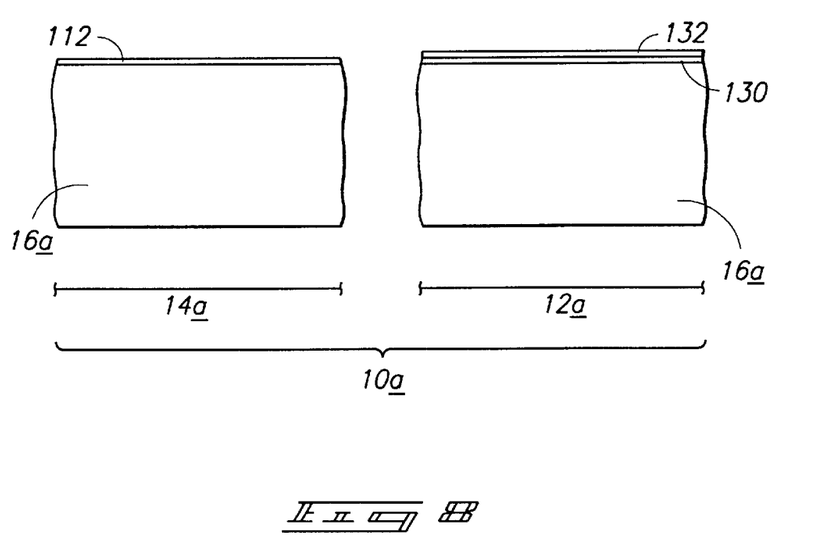
FIG. 8 is a diagrammatic, fragmentary, schematic, cross-sectional view of a semiconductor wafer fragment processed according to a second embodiment method of forming the construction of FIG. 2, and shown at an initial processing step.

Referring to FIG. 8, insulative materials 112 and 130 are formed over substrate 16a in regions 14a and 12a, and titanium nitride material 132 is formed over insulative material 130. If material 112 comprises silicon dioxide, any titanium nitride formed over material 112 can be removed with an etch selective for titanium nitride relative to silicon dioxide.

Figure 9:
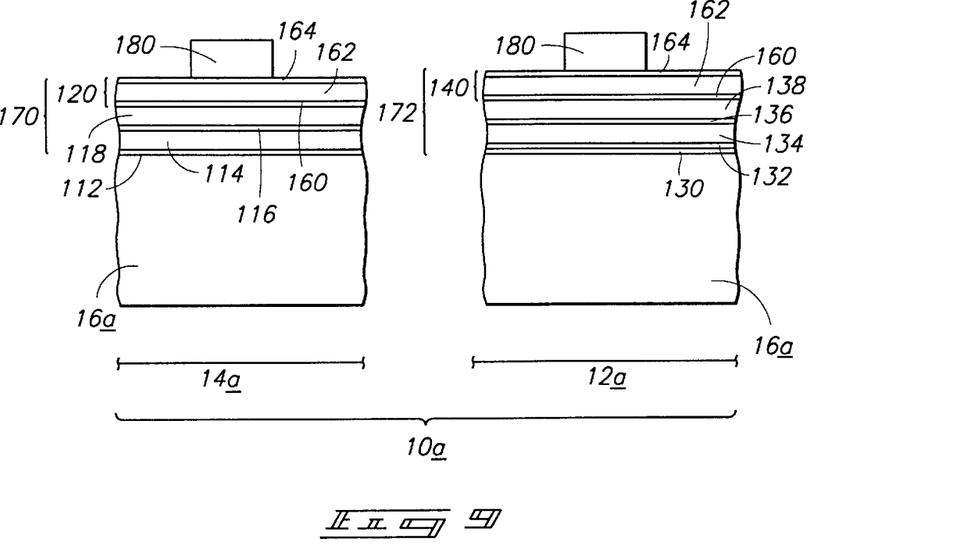
FIG. 9 is a view of the FIG. 8 wafer fragment shown at a step subsequent to that of FIG. 8.

Referring to FIG. 9, materials 114, 116, 118 and 120 are formed over substrate 16a in peripheral region 14a, and materials 134, 136, 138 and 140 are formed over substrate 16a in region 12a. Preferably, materials 114 and 134 are the same composition and are formed in a common processing step. Such processing step can comprise, for example, chemical vapor deposition of polysilicon and doping of such polysilicon with a conductivity-enhancing dopant. Also preferably, materials 116 and 136 are the same composition and are formed in a common processing step. Such common processing step can comprise, for example, chemical vapor deposition of titanium nitride, plasma enhanced chemical vapor deposition of titanium nitride, or sputter deposition of titanium nitride. Further, materials 118 and 138 preferably are the same composition and are formed in a common processing step. Such common processing step can comprise, for example, sputter deposition of tungsten. Finally, materials 120 and 140 are preferably the same composition and are formed in common processing steps, such as the steps described above with reference to FIG. 6.

Materials 112, 114, 116, 118 and 120 form a first stack 170, while materials 130, 132, 134, 136, 138 and 140 form a second stack 172. A patterned masking material 180 is formed over stacks 170 and 172, and can be utilized to transfer a pattern to stacks 170 and 172 in processing of the type described above with reference to FIG. 7. Such processing will form gate stacks, and such gate stacks can be incorporated into transistor assemblies of the type described with reference to FIG. 2.

The transistor device 102 described above with reference to FIG. 2 is an exemplary transistor device of the present invention. Another exemplary transistor device is described with reference to FIGS. 10–12. In referring to FIGS. 10–12, similar numbering to that utilized above in FIG. 2 will be used, with the suffix "b" utilized to indicate structures referred to in FIGS. 10–12.

Figure 10:
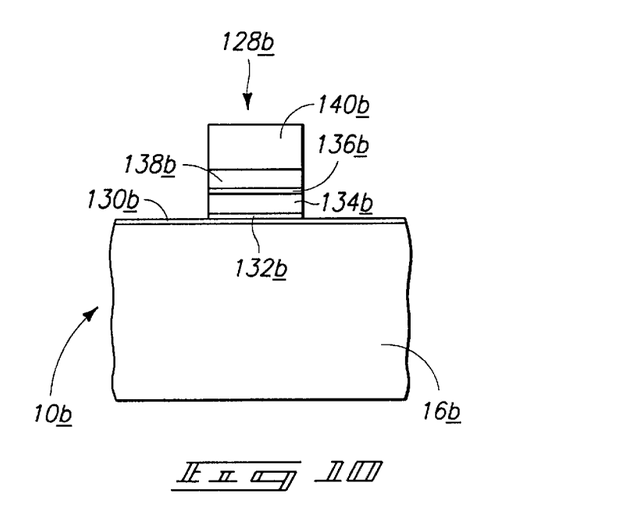
FIG. 10 is a diagrammatic, fragmentary, cross-sectional view of a semiconductor wafer fragment shown at an initial step of a processing sequence of the present invention for forming a field effect transistor.

Referring to FIG. 10, a semiconductive wafer fragment 10b is illustrated at an initial step in formation of a transistor device. Wafer fragment 10b comprises a substrate 16b having an insulative material 130b formed thereover. A gate stack 128b is formed over insulative material 130b. Gate stack 128b comprises a first conductive nitride material 132b, a conductively doped semiconductive material 134b, a second conductive nitride material 136b, and a metal-containing material 138b. Stack 128b further comprises an insulative cap 140b formed over metal-containing material 138b. Materials 130b, 132b, 134b, 136b, 138b and 140b can be identical to the materials 130, 132, 134, 136, 138 and 140, respectively, of FIG. 2.

Figure 11:
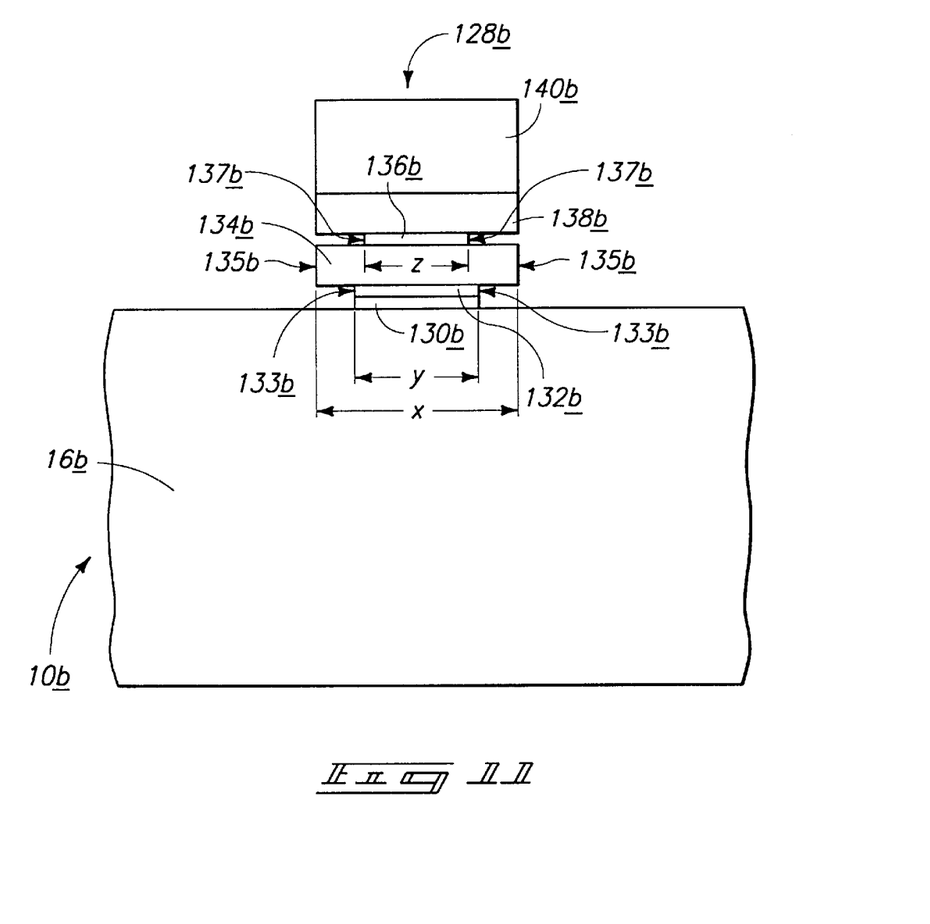
FIG. 11 is a view of the FIG. 10 wafer fragment shown at a processing step subsequent to that of FIG. 10.

Referring to FIG. 11, stack 128b is exposed to etching conditions which selectively etch the layers defined by conductive nitride materials 132b and 136b relative to the layer defined by semiconductive material 134b and the layer defined by metal 138b. In a particular embodiment, materials 132b and 136b comprise titanium nitride, material 134b comprises conductively doped polysilicon, and material 138b comprises tungsten. In such embodiment, the selective etching of FIG. 11 can comprise, for example, exposing stack 128b to hydrofluoric acid. It is noted that the hydrofluoric acid can etch insulative material 130b in embodiments in which material 130b comprises silicon dioxide.

After the exposure to hydrofluoric acid, the layer defined by semiconductive material 134b comprises a first lateral width "x", and the layers defined by conductive nitride materials 132b and 136b comprise lateral widths "y" and "z", respectively. The lateral widths "y" and "z", are less than lateral width "x", and are approximately equal to one another. By "approximately equal", it is meant that the layers defined by materials 132b and 136b started as having the same lateral widths (due to their incorporation into the same gate stack), and were exposed to common etching conditions. Accordingly, such layers have lateral widths which are equal to each other to the extent achievable by exposing the layers to equivalent etching conditions.

The layer defined by material 132b has edges 133b, and the layer defined by material 136b has edges 137b. Further, the layer defined by material 134b has edges 135b. After the etching of materials 132b and 136b, edges 133b and 137b are inset relative to edges 135b of semiconductive material 134b.

Figure 12:
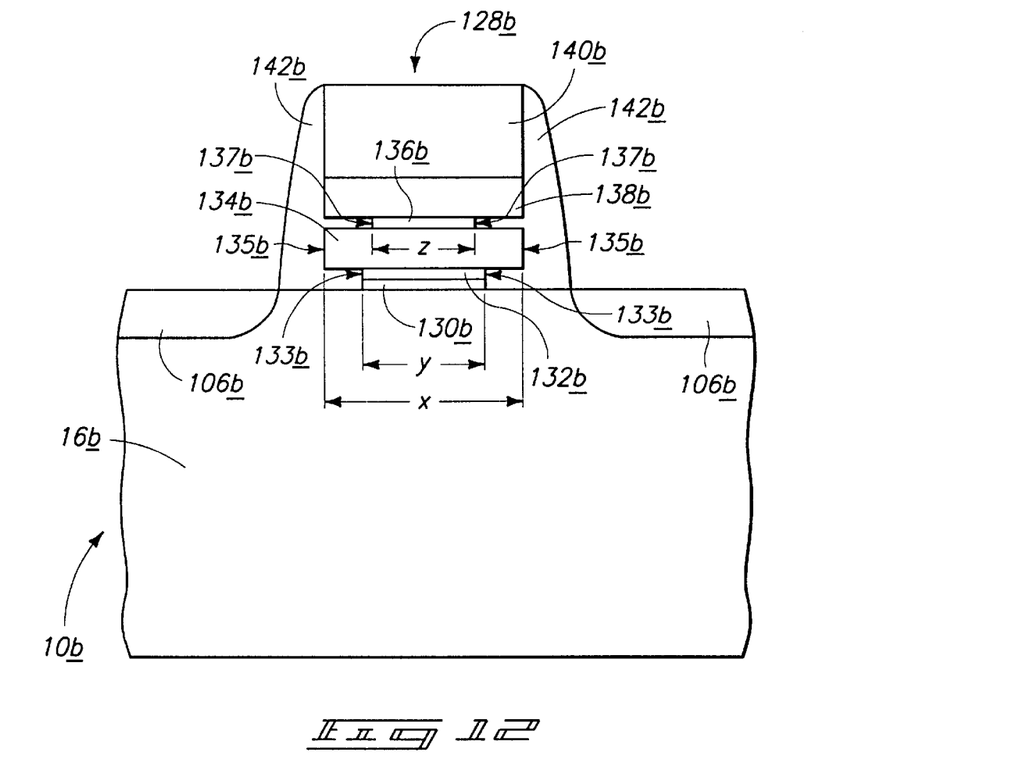
FIG. 12 is a view of the FIG. 10 wafer fragment shown at a processing step subsequent to that of FIG. 11.

Referring to FIG. 12, insulative sidewall spacers 142b are formed along sidewalls of gate stack 128b. Spacers 142b comprise an insulative material which extends from inset edges 133b and 137b to at least the edges 135b of material 134b. The insulative material of spacers 142b can comprise, for example, silicon nitride or silicon dioxide.

After formation of spacers 142b, a conductivity enhancing dopant can be implanted into substrate 16b proximate gate stack 128b to form source/drain regions 106b.

The construction of FIG. 12 effectively has an undercut etch of titanium nitride material 132b relative to semiconductive material 134b. Such undercut etch enables a thicker dielectric to be provided at the edge of the gate (i.e., underneath a portion of semiconductive material 134b that overhangs beyond edge 133b of nitride layer 132b). The thicker dielectric at the edge of the gate can reduce gate-induced drain leakage (GIDL) and hot carrier effects of a transistor device. Thus, the thicker dielectric can make a transistor device less leaky and more reliable.

Yet another exemplary transistor device is described with reference to FIGS. 13–15. In referring to FIGS. 13–15, similar numbering to that utilized above in FIGS. 10–12 will be used, with the suffix "c" utilized to indicate structures referred to in FIGS. 13–15.

Figure 13:
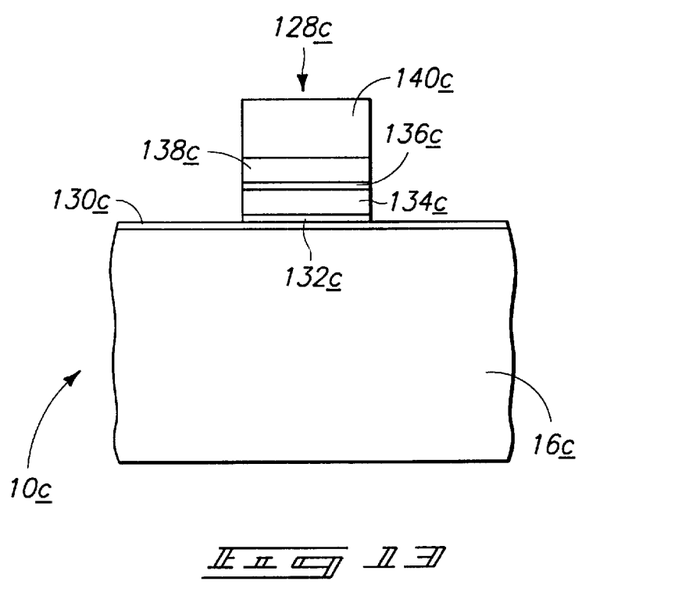
FIG. 13 is a diagrammatic, fragmentary, cross-sectional view of a semiconductor wafer fragment shown at an initial step of a second embodiment processing sequence of the present invention for forming a field effect transistor.

Referring to FIG. 13, a semiconductive wafer fragment 10c is illustrated at an initial step in formation of a transistor device. Wafer fragment 10c comprises a substrate 16c having an insulative material 130c formed thereover. A gate stack 128c is formed over insulative material 130c. Gate stack 128c comprises a first conductive nitride material 132c, a conductively doped semiconductive material 134c, a second conductive nitride material 136c, and a metal-containing material 138c. Stack 128c further comprises an insulative cap 140c is formed over metal-containing material 138c. Materials 130c, 132c, 134c, 136c, 138c and 140c can be identical to the materials 130, 132, 134, 136, 138 and 140, respectively, of FIG. 2.

Figure 14:
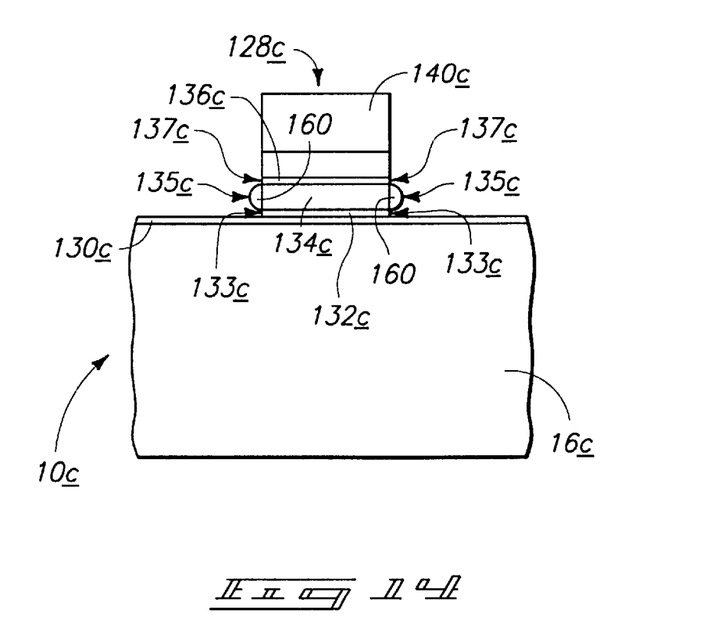
FIG. 14 is a view of the FIG. 13 wafer fragment shown at a processing step subsequent to that of FIG. 13.

Referring to FIG. 14, stack 128c is exposed to conditions which selectively form extensions 160 over the edges of the material of layer 134c. In a particular embodiment, materials 132c and 136c comprise titanium nitride, material 134c comprises conductively doped polysilicon, and material 138c comprises tungsten. In such embodiment, the selective formation of extensions 160 can comprise utilization of conditions which oxidize polysilicon faster than titanium nitride and tungsten to accordingly grow silicon dioxide over the exposed edges of the polysilicon.

After the formation of extensions 160, the layer defined by material 132c has edges 133c, the layer defined by material 136c has edges 137c, and a layer defined by material 134c and extensions 160 has edges 135c. Edges 133c and 137c are inset relative to edges 135c of semiconductive material 134c. Accordingly, the layer defined by semiconductive material 134c and extensions 160 comprises a first lateral width which is greater than the lateral widths of layers 132c and 136c.

Figure 15:
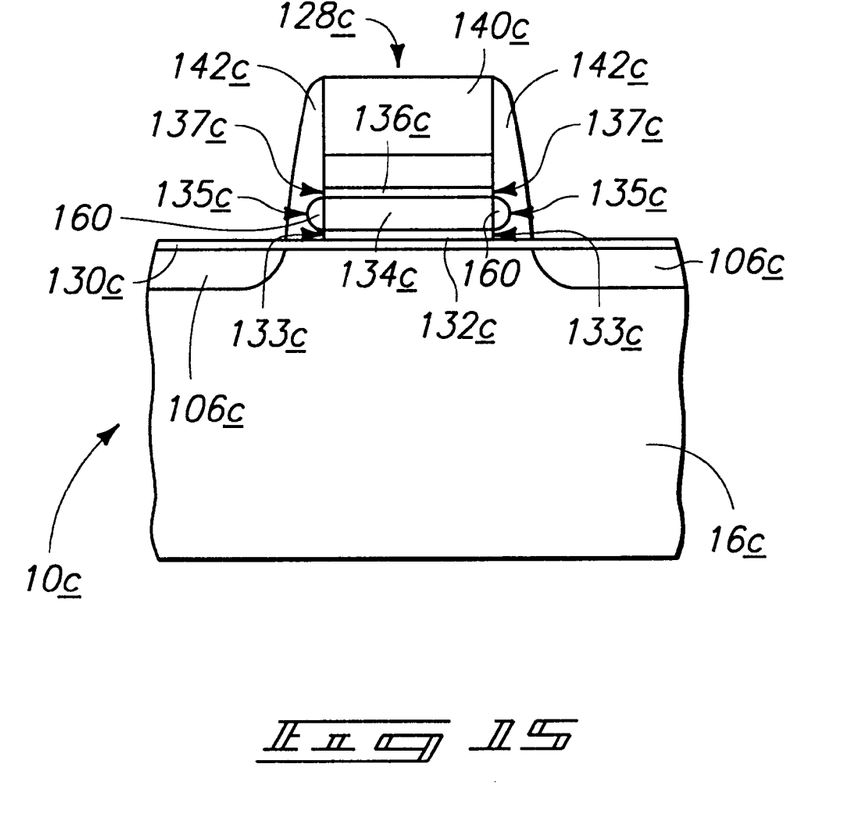
FIG. 15 is a view of the FIG. 13 wafer fragment shown at a processing step subsequent to that of FIG. 14.

Referring to FIG. 15, insulative sidewall spacers 142c are formed along sidewalls of gate stack 128c. Spacers 142c comprise an insulative material which extends from inset edges 133c and 137c to at least the edges 135c. The insulative material of spacers 142c can comprise, for example, silicon nitride or silicon dioxide.

After formation of spacers 142c, a conductivity enhancing dopant can be implanted into substrate 16c proximate gate stack 128c to form source/drain regions 106c.

The transistor device structures described above with reference to FIGS. 2, 12 and 15 incorporate titanium-nitride-containing layers into gate stacks to enable, among other things, low threshold voltage control of transistor devices formed from the gate stacks. Such can enable advantages to be realized with the gate stacks that were previously sought through reduction, or other adjustment, of gate dielectric material thickness.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. Integrated circuitry, comprising:
   a semiconductive material substrate;
   a first field effect transistor supported by the substrate; the first field effect transistor comprising a first transistor gate assembly which includes a first layer of conductively doped semiconductive material and only one layer of conductive nitride; and
   a second field effect transistor supported by the substrate; the second field effect transistor comprising a second transistor gate assembly which includes a second layer of conductively doped semiconductive material and at least two layers of conductive nitride.

2. The circuitry of claim 1 wherein the at least two layers of conductive nitride of the second field effect transistor are separated from one another by the second layer of conductively doped semiconductive material.

3. The circuitry of claim 1 wherein the only one conductive nitride layer of the first field effect transistor comprises a substantially homogeneous composition throughout an entirety of its thickness.

4. The circuitry of claim 1 wherein the first field effect transistor is part of a memory array, and wherein the second field effect transistor is peripheral to the memory array.

5. The circuitry of claim 1 wherein the first and second layers of conductively doped semiconductive material comprise conductively doped polysilicon.

6. The circuitry of claim 1 wherein the one layer of conductive nitride of the first field effect transistor comprises titanium nitride, and wherein the at least two layers of conductive nitride of the second field effect transistor comprise titanium nitride.

7. Integrated circuitry, comprising:
   a semiconductive material substrate;
   a first field effect transistor supported by the substrate; the first field effect transistor comprising a first transistor gate stack which includes a first layer of conductively doped semiconductive material and at least one layer of conductive nitride material, the first layer of conductively doped semiconductive material not being between any layers of conductive nitride of the first transistor gate stack; and
   a second field effect transistor supported by the substrate; the second field effect transistor comprising a second transistor gate stack which includes a second layer of conductively doped semiconductive material and at least two layers of conductive nitride separated from one another by the second layer conductively doped semiconductive material.

8. The circuitry of claim 7 wherein the first field effect transistor is part of a memory array, and wherein the second field effect transistor is peripheral to the memory array.

9. The circuitry of claim 7 wherein the at least one layer of conductive nitride of the first field effect transistor comprises titanium nitride, and wherein the at least two layers of conductive nitride of the second field effect transistor comprise titanium nitride.

10. The circuitry of claim 7 wherein the second layer of conductively doped semiconductive material comprises a first lateral width over the substrate, and wherein at least two layers of conductive nitride of the second field effect transistor have lateral widths less than said first lateral width.

11. Integrated circuitry, comprising:
    a semiconductive material substrate;
    a first field effect transistor supported by the substrate, and comprising:

a pair of first source/drain regions;
a first channel region between the first source/drain regions;
a first transistor gate assembly along the first channel region, the first transistor gate assembly comprising a stack having at least a portion consisting of the following materials stacked in the following order from the first channel region;
a first insulative material;
a first conductively doped semiconductive material; and
a first conductive nitride material;
a second field effect transistor supported by the substrate, and comprising:
a pair of second source/drain regions;
a second channel region between the second source/drain regions;
a second transistor gate assembly along the second channel region, the second transistor gate assembly comprising the following materials stacked in the following order from the second channel region;
a second insulative material;
a second conductive nitride material;
a second conductively doped semiconductive material; and
a third conductive nitride material.

12. The circuitry of claim 11 wherein the first, second and third conductive nitride layers comprise titanium nitride.

13. The circuitry of claim 11 wherein the first field effect transistor gate assembly further comprises a layer of metal stacked over the first conductive nitride material.

14. The circuitry of claim 13 wherein the layer of metal comprises tungsten, and wherein the first conductive nitride material comprises TiN.

15. The circuitry of claim 11 wherein the second field effect transistor gate assembly further comprises a layer of metal stacked over the third conductive nitride material.

16. The circuitry of claim 15 wherein the layer of metal comprises tungsten, and wherein the third conductive nitride material comprises TiN.

17. The circuitry of claim 11 wherein the first and second insulative materials are the same as one another and comprise silicon dioxide.

18. The circuitry of claim 11 wherein the first and second insulative materials are the same as one another and comprise tantalum pentoxide.

19. The circuitry of claim 11 wherein the first and second conductively doped semiconductive materials are the same as one another and comprise conductively doped polysilicon.

20. The circuitry of claim 11 wherein the first field effect transistor is part of a memory array, and wherein the second field effect transistor is peripheral to the memory array.

21. The circuitry of claim 11 wherein the second layer of conductively doped semiconductive material comprises a first lateral width over the substrate, and wherein the second and third conductive nitride materials are comprised by second and third conductive nitride layers, respectively; the second and third conductive nitride layers having lateral widths less than said first lateral width.

22. A field effect transistor, comprising:
a pair of source/drain regions separated from one another by a channel region;
a gate over the channel region, the gate comprising a conductively doped silicon material received between and contacting a pair of conductive nitride layers; one of the conductive nitride layers of the pair being beneath the conductively doped silicon material, and the other of the conductive nitride layers of the pair being over the conductively doped silicon material.

23. The transistor of claim 22 wherein the pair of conductive nitride layers comprise titanium nitride.

24. The transistor of claim 22 wherein the gate consists essentially of the pair of conductive nitride layers, the conductively doped silicon material, and a metal layer.

25. A field effect transistor assembly, comprising:
a substrate;
source/drain regions supported by the substrate;
a channel region between the source/drain regions; and
a gate stack proximate the channel region, the gate stack comprising:
a conductively doped semiconductive material between and against a pair of conductive nitride layers; one of the conductive nitride layers of the pair being between the conductively doped semiconductive material and the channel region, and the conductively doped semiconductive material being between the other of the conductive nitride layers of the pair and the channel region.

26. The assembly of claim 25 wherein the conductive nitride layers comprise titanium nitride.

27. The assembly of claim 25 wherein the conductively doped semiconductive material comprises a first lateral width over the substrate, and wherein the pair of conductive nitride layers have lateral widths less than said first lateral width.

28. A field effect transistor assembly, comprising:
a substrate;
source/drain regions supported by the substrate;
a channel region between the source/drain regions;
an insulative material along the channel region; and
a gate stack proximate the channel region, the gate stack comprising:
a first conductive nitride layer separated from the channel region by the insulative material;
a conductively doped semiconductive material proximate the first conductive nitride layer; the conductively doped semiconductive material being separated from the channel region by the first conductive nitride layer and the insulative material; and
a second conductive nitride layer separated from the first conductive nitride layer by the conductively doped semiconductive material, the second conductive nitride layer being separated from the channel region by a stack comprising the combined semiconductive material, first conductive nitride layer and insulative material.

29. The assembly of claim 28 wherein the insulative material along the channel region comprises one or both of silicon dioxide and tantalum pentoxide.

30. The assembly of claim 28 wherein the conductive nitride layers comprise titanium nitride.

31. The assembly of claim 28 wherein the conductively doped semiconductive material has a first width extending along the channel region, the first conductive nitride layer has a second width extending along the channel region, and the second conductive nitride layer has a third width extending along the channel region, and wherein the second and third widths are less than the first width.

32. The assembly of claim 31 wherein the second and third widths are about equal to one another.

33. The assembly of claim 31 wherein the first and second conductive nitride layers have edges inset relative to edges of the conductively doped semiconductive material, the field effect transistor further comprising an insulative material at the inset edges of the first and second conductive nitride layers, the insulative material extending from the inset edges of the conductive nitride layers to at least the edges of the conductively doped semiconductive material.

* * * * *

UNITED STATES PATENT AND TRADEMARK OFFICE
CERTIFICATE OF CORRECTION

PATENT NO.     : 6,498,378 B1
DATED          : December 24, 2002
INVENTOR(S)    : Fernando Gonzalez et al.

It is certified that error appears in the above-identified patent and that said Letters Patent is hereby corrected as shown below:

<u>Title page, Item [54], and Column 1, Lines 1-3,</u>
Replace "METHODS OF FORMING FIELD EFFECT TRANSISTORS AND INTEGRATED CIRCUITRY" with -- FIELD EFFECT TRANSISTORS AND INTEGRATED CIRCUITRY --

<u>Column 1,</u>
Line 37, replace "materials including gate dielectric 22, a conductively doped" with
-- materials including a gate dielectric 22, a conductively doped --
Line 42, replace "$10^9$ atoms/cm$^3$ with either n-type or p-type conductivity" with
-- $10^{19}$ atoms/cm$^3$ with either n-type or p-type conductivity --

<u>Column 4,</u>
Line 29, replace "dioxide, silicon nitride, SiN$_x$O$_y$, or tantalum pentoxide," with
-- dioxide, silicon nitride, SiN$_x$O$_y$, or tantalum pentoxide. --

<u>Column 9,</u>
Line 17, replace "insulative cap 140*c* is formed over metal-containing material" with -- insulative cap 140*c* formed over metal-containing material --

Signed and Sealed this

Twenty-second Day of July, 2003

JAMES E. ROGAN
*Director of the United States Patent and Trademark Office*